US012756423B2

(12) United States Patent
McLaughlin

(10) Patent No.: US 12,756,423 B2
(45) Date of Patent: Oct. 6, 2026

(54) ULTRA-WIDEBAND METHOD AND APPARATUS

(71) Applicant: Decawave Limited, Dublin (IE)

(72) Inventor: Michael McLaughlin, Dublin (IE)

(73) Assignee: Decawave Limited, Dublin (IE)

( * ) Notice: Subject to any disclaimer, the term of this patent is extended or adjusted under 35 U.S.C. 154(b) by 0 days.

(21) Appl. No.: 19/014,829

(22) Filed: Jan. 9, 2025

(65) Prior Publication Data

US 2025/0150116 A1 May 8, 2025

Related U.S. Application Data

(63) Continuation of application No. 18/434,089, filed on Feb. 6, 2024, now Pat. No. 12,237,865, which is a continuation of application No. 17/590,582, filed on Feb. 1, 2022, now Pat. No. 11,936,420, which is a continuation of application No. 16/789,180, filed on Feb. 12, 2020, now Pat. No. 11,239,882.

(60) Provisional application No. 62/804,723, filed on Feb. 12, 2019.

(51) Int. Cl.
*H04B 1/71* (2011.01)
*H03M 13/41* (2006.01)
*H04B 1/38* (2015.01)
*H04B 1/717* (2011.01)

(52) U.S. Cl.
CPC .......... *H04B 1/7174* (2013.01); *H03M 13/41* (2013.01); *H04B 1/38* (2013.01)

(58) Field of Classification Search
CPC ...... H04B 1/7174; H04B 1/38; H04B 1/7176; H03M 13/14; H03M 13/41; H03M 13/23
See application file for complete search history.

(56) References Cited

U.S. PATENT DOCUMENTS 7,636,397 B2 12/2009 McLaughlin
7,853,859 B2 12/2010 Ojard
8,358,709 B2 1/2013 McLaughlin
8,437,432 B2 5/2013 McLaughlin et al.
8,929,352 B2 * 1/2015 Fettweis ................. H04L 5/003 370/344
10,291,436 B2 5/2019 Dutz et al.
11,239,882 B2 2/2022 McLaughlin
11,936,420 B2 3/2024 McLaughlin
12,015,980 B2 * 6/2024 Kristem ................ H04L 5/0092
12,237,865 B2 2/2025 McLaughlin
(Continued)

OTHER PUBLICATIONS

Author Unknown, "Amendment 1: Enhanced Ultra Wideband (UWB) Physical Layers (PHYs) and Associated Ranging Techniques," IEEE Standard for Low-Rate Wireless Networks, 802.15.4z, Jun. 2020, 174 pages.

(Continued)

*Primary Examiner* — Dac V Ha
(74) *Attorney, Agent, or Firm* — Withrow & Terranova, P.L.L.C.

(57) ABSTRACT

An ultra-wideband (UWB) communication system comprising a transmitter and a receiver is disclosed. In one embodiment, a symbol mapper circuit in the transmitter is adapted, in a first mode, to develop symbols having the number of pulses as currently defined in the 4z Standard; and, in a second mode, to develop symbols having fewer pulses than as currently defined in the 4z Standard. In an optional third mode, each data bit is mapped to a single pulse.

22 Claims, 4 Drawing Sheets

(56) References Cited

U.S. PATENT DOCUMENTS

| | | | | |
|---|---|---|---|---|
| 2006/0039272 | A1 * | 2/2006 | Sikri | H04L 5/0016 370/208 |
| 2007/0205921 | A1 | 9/2007 | Sawitzki | |
| 2009/0262700 | A1 | 10/2009 | Franceschini et al. | |
| 2011/0129032 | A1 | 6/2011 | Batra et al. | |
| 2014/0269843 | A1 | 9/2014 | Schaffner | |
| 2018/0254925 | A1 | 9/2018 | Dutz et al. | |

OTHER PUBLICATIONS

Fisher, Reed, et al., "DS-UWB Physical Layer Submission to 802.15 Task Group 3a," Jan. 2005, IEEE P802.15 Working Group for Wireless personal Area Network, 44 pages.

Khan, Waqas Ali, et al., "High Level Modeling of an Ultra Wide-Band Baseband Transmitter in MATLAB," International Conference on Emerging Technologies, 2009, pp. 194-199.

Verso, Billy, et al., "HRP UWB PHY enhanced mode converged consensus," IEEE P802.15 Working Group for Wireless Personal Area Networks (WPANs), Nov. 2018, 11 pages.

* cited by examiner

Prior Art

AWGN Performance

Multipath Performance

ULTRA-WIDEBAND METHOD AND APPARATUS

RELATED APPLICATIONS

This application is a continuation of U.S. patent application Ser. No. 18/434,089, filed Feb. 6, 2024, now U.S. Pat. No. 12,237,865, which is a continuation of U.S. patent application Ser. No. 17/590,582, filed Feb. 1, 2022, now U.S. Pat. No. 11,936,420, issued Mar. 19, 2024, which is a continuation of U.S. patent application Ser. No. 16/789,180, filed Feb. 12, 2020, now U.S. Pat. No. 11,239,882, issued Feb. 1, 2022, which claims the benefit of provisional patent application Ser. No. 62/804,723, filed Feb. 12, 2019 (hereinafter "Parent Provisional"), the disclosures of which are hereby incorporated herein by reference in their entireties.

The subject matter of this application is related to U.S. Pat. No. 7,636,397, issued Dec. 22, 2009 (hereinafter "First Related Patent"); U.S. Pat. No. 8,358,709, issued Jan. 22, 2013 (hereinafter "Second Related Patent"); and U.S. Pat. No. 8,437,432, issued May 7, 2013 (hereinafter "Third Related Patent"), the subject matter of which are hereby incorporated herein by reference in their entireties.

The subject matter of this application is related to the following published articles, copies of which are submitted herewith and the subject matter of which are hereby incorporated herein by reference in their entireties:

Waqas Ali Khan et al., "High Level Modeling of an Ultra Wide-Band Baseband Transmitter in MATLAB," 2009 International Conference on Emerging Technologies, 2009 (hereinafter "First Related Article");

Billy Verso et al., "HRP UWB PHY enhanced mode converged consensus," IEEE P802.15, 2018 (hereinafter "Second Related Article"); and IEEE Standard 802.15.4z, "Enhanced Ultra WideBand (UWB) Physical Layers (PHYs) and Associated Ranging Techniques," 2020 (hereinafter "4z Standard").

FIELD OF THE DISCLOSURE

The present invention relates generally to ultra-wideband (UWB) communication systems, and, in particular, to an improved packet-based UWB method and apparatus having a higher data transmission rate.

BACKGROUND

In general, in the descriptions that follow, I will italicize the first occurrence of each special term of art which should be familiar to those skilled in the art of ultra-wideband (UWB) communication systems. In addition, when I first introduce a term that I believe to be new or that I will use in a context that I believe to be new, I will bold the term and provide the definition that I intend to apply to that term. In addition, throughout this description, I will sometimes use the terms "assert" and "negate" when referring to the rendering of a signal, a signal flag, a status bit, or a similar apparatus into its logically true or logically false state, respectively. I will use the term "toggle" to indicate the logical inversion of a signal from one logical state to the other. Alternatively, I may refer to mutually exclusive boolean states as "logic_ 0" and "logic_ 1." Of course, as is well known, a consistent system operation can be obtained by reversing a logic sense of all such signals, such that the signals described herein as logically true become logically false, and vice versa. Furthermore, it is of no relevance in such systems which specific voltage levels are selected to represent each logic state.

In accordance with the 4z Standard, data to be transmitted is first encoded into a stream of symbols. A systematic convolutional encoder then convolutionally encodes bits comprising each symbol. See, e.g., FIG. 2 and FIG. 3. A symbol mapper then maps each coded bit into a frame comprising a selected number of chips. Each chip comprises either a pulse of energy or a chip-period of silence. In accordance with the frame, pulses are grouped to form bursts, with each burst being followed by a guard interval comprising one or more silent periods. See, Second Related Article. In accordance with this scheme, a data transmission rate for a given mode is related to the total number of chips in the frame and a time duration of each chip. Specifically, a symbol is transmitted within a symbol frame $T_{dsym}$, where the symbol frame $T_{dsym}$ includes a number of burst periods $T_{burst}$, each of which are followed by a Guard Interval. Each one of the burst periods $T_{burst}$ and each one of the Guard Intervals includes the same number of chip periods $T_{chip}$. For example, each of the burst periods $T_{burst}$ and each of the Guard Intervals may include four of the chip periods $T_{chip}$, however, the 4z Standard also details situations in which more of the chip periods $T_{chip}$ are included in each of the burst periods $T_{burst}$ and each of the Guard Intervals. In the burst periods $T_{burst}$, a pulse is either sent or skipped in each of the chip periods $T_{chip}$, where a sent pulse corresponds to a one and a skipped pulse corresponds to a zero. No pulses are sent during each of the Guard Intervals, which follows each of the burst periods $T_{burst}$. The pulses sent during each of the burst periods $T_{burst}$ are determined by the symbol mapper. Table 1 below shows an exemplary mapping of the convolutionally encoded bits from the convolutional encoder shown in FIG. 2 to the pulses sent in each of the burst frames $T_{burst}$:

TABLE 1

| $G_0$ | $G_1$ | First burst | Second burst |
|---|---|---|---|
| 0 | 0 | 0000 | 0000 |
| 1 | 0 | 1111 | 0000 |
| 0 | 1 | 0000 | 1111 |
| 1 | 1 | 1111 | 1111 |

As shown in Table 1 above, for every 2 bits of encoded data ($G_0$ and $G_1$), eight active chip periods $T_{chip}$ (chip periods within the burst frames $T_{burst}$) are used and eight inactive chip periods $T_{chip}$ (chip periods within the Guard Intervals) are used for a total of sixteen chip periods $T_{chip}$ within the symbol frame $T_{dsym}$. As discussed above, the data transmission rate is based on the number of chip periods $T_{chip}$ in the symbol frame $T_{dsym}$ and the time duration of each of the chip periods $T_{chip}$.

In coding theory, puncturing is the process of removing some parity bits after encoding with an error-correction code, see, e.g., the First Related Article. It has recently been proposed to apply this process to a standard K=7 convolutional encoder to increase the effective bit rate from 55 Mbps to 31.2 Mbps. A similar puncturing scheme could be used with a K=3 convolutional encoder to get a 48 Mbps mode. Although puncturing does increase the bit rate, a resulting loss in coding gain is large.

What is needed is an improved method and apparatus for use in a UWB communication system for a higher data transmission rate. In particular, I submit that such a method and apparatus should provide performance generally comparable to the best prior art techniques, but more efficiently than known implementations of such prior art techniques.

SUMMARY

In accordance with one embodiment of my invention, I provide a method for transmitting data at much faster rates than currently defined in the 4z Standard.

In another embodiment, I provide an ultra-wideband (UWB) communication system comprising a symbol mapper configured to perform my method.

The methods of my invention may be embodied in a non-transitory computer readable code on a suitable computer readable medium such that, when a processor executes the computer readable code, the processor executes the respective method.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
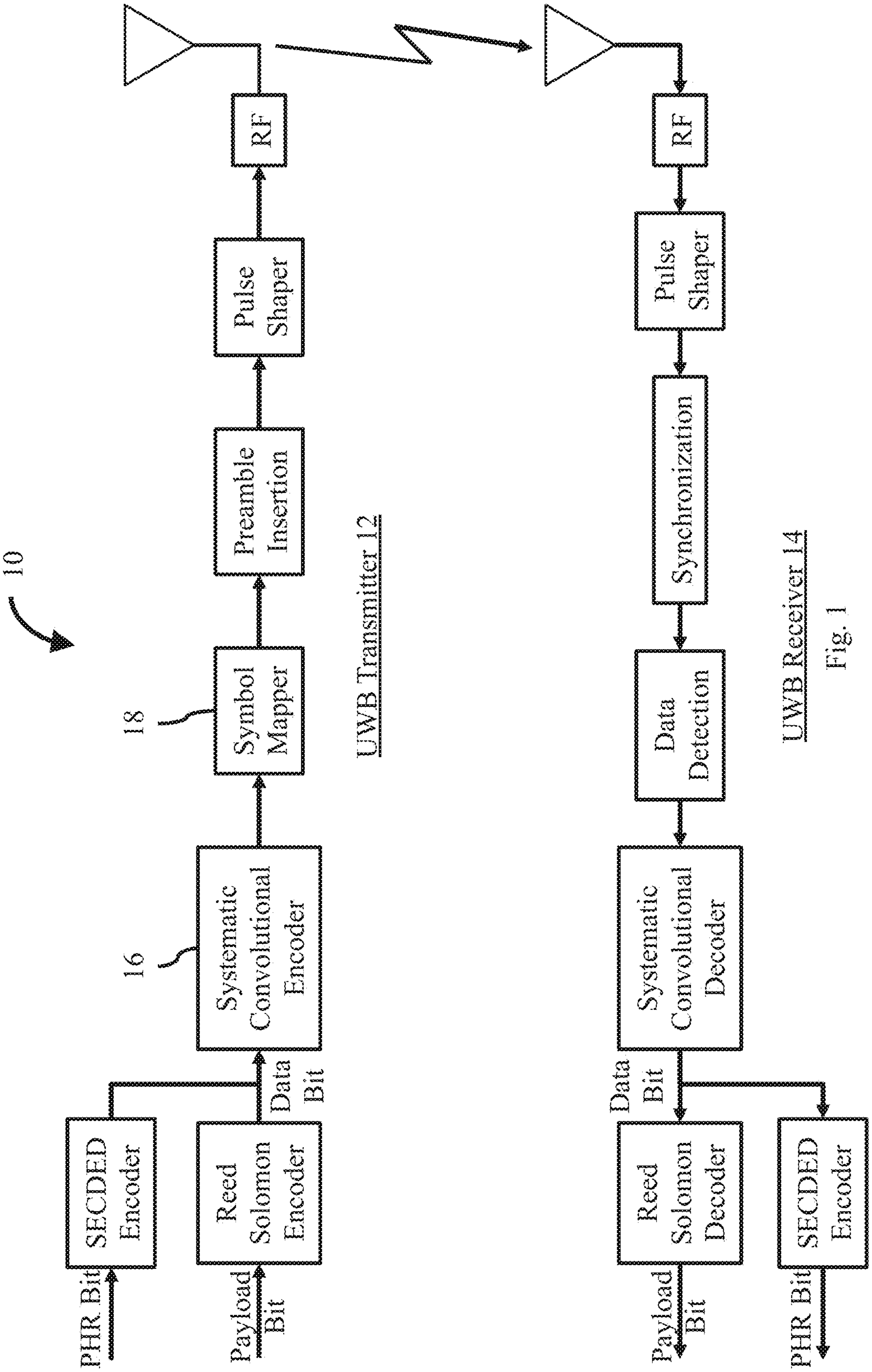
FIG. 1 illustrates, in block diagram form, an ultra-wideband (UWB) communication system adapted to practice my method.

In the drawings, similar elements will be similarly numbered whenever possible. However, this practice is simply for convenience of reference and to avoid unnecessary proliferation of numbers and is not intended to imply or suggest that my invention requires identity in either function or structure in the several embodiments.

DETAILED DESCRIPTION

Figure 4:
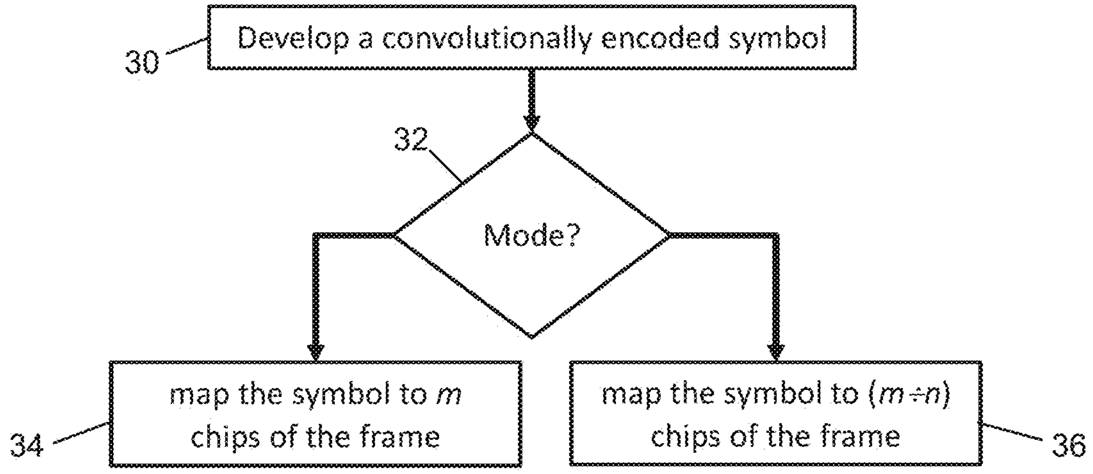
FIG. 4 illustrates, in flow diagram form, one embodiment of my method.

Illustrated in FIG. 1 is an ultra-wideband (UWB) communication system 10 comprising a UWB transmitter 12 and a UWB receiver 14. In the UWB communication system 10, n data bits are received for transmission, wherein n is a selected power of 2 greater than 1 and less than or equal to m, wherein m is greater than 1. For each data bit, a respective symbol is developed by a conventional systematic convolutional encoder 16. In a first mode of operation, my improved symbol mapper 18 is configured to map each symbol to m pulses of a packet. See, e.g., the 4z Standard. In a second mode of operation, my symbol mapper 18 is configured to map each symbol to (m÷n) pulses of the packet. In one embodiment, I select n from a sequence [2, 4, 8], but those skilled in this art will recognize that other powers are possible. FIG. 4 is a flowchart outlining steps of a method according to one embodiment. Referring to block 30, a first step includes developing a convolutionally encoded symbol. Decision block 32 includes selection of a first mode of operation according to block 34 or a second mode of operation according to block 36. Block 34 corresponds to the first mode of operation, which includes mapping the symbol to m chips of the frame. Block 36 corresponds to the second mode of operation, which includes mapping the symbol to m÷n chips of the frame.

Figure 2:
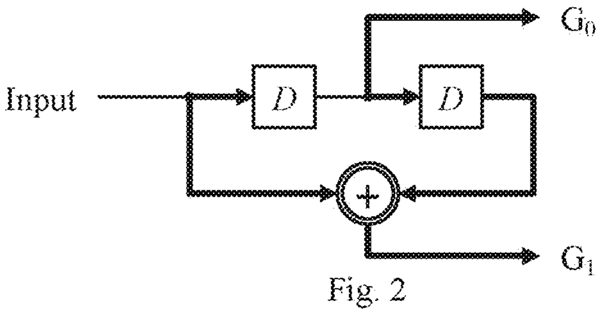
Fig. 2 Prior Art
FIG. 2 illustrates, in block diagram form, a K=3 systematic convolutional encoder set forth in the 4z Standard.
Figure 3:
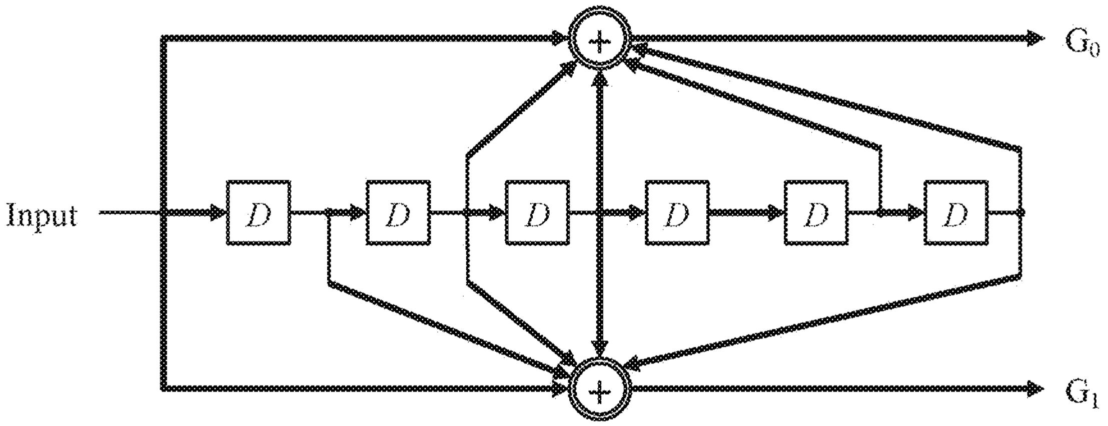
FIG. 3 illustrates, in block diagram form, a K=7 systematic convolutional encoder set forth in the 4z Standard.

By way of example, let us first consider the following examples in which n is selected to be 2:

- Using the 4z Standard K=3 encoder (K3_Reference, FIG. 2) to develop symbols at a rate of 27.2 Mbps, my symbol mapper 18 is configured to: map G0 to 4 pulses; insert 4 silent chips; map G1 to 4 pulses; and insert 4 additional silent chips.
- Using the K3_Reference to develop symbols at a rate of 54.5 Mbps, my symbol mapper 18 is configured to: map G0 to only 2 pulses; map G1 to only 2 pulses; and insert 4 silent chips.
- Using the 4z Standard K=7 encoder (K7_Reference, FIG. 3) to develop symbols at a rate of 31.2 Mbps, my symbol mapper 18 is configured to: map G0 to 4 pulses; insert 4 silent chips; map G1 to 4 pulses; and insert 4 additional silent chips.
- Using the K7_Reference to develop symbols at a rate of 62.4 Mbps, my symbol mapper 18 is configured to: map G0 to only 2 pulses; map G1 to only 2 pulses; and insert 4 silent chips.

Now, let us consider the following examples in which n is selected to be 4:

- Using the K3_Reference to develop symbols at a rate of 27.2 Mbps, my symbol mapper 18 is configured to: map G0 to only 1 pulse; map G1 to only 1 pulse; and insert only 2 silent chips. The resulting symbol rate will be 109 Mbps.
- Using the K7_Reference to develop symbols at a rate of 31.2 Mbps, my symbol mapper 18 is configured to: map G0 to only 1 pulse; map G1 to only 1 pulse; and insert only 2 silent chips. The resulting symbol rate will be 125 Mbps.

Let us now consider the following examples in which n is selected to be 8:

- Using the K3_Reference to develop symbols at a rate of 27.2 Mbps, my symbol mapper 18 is configured to: map G0 to only 1 pulse; map G1 to only 1 pulse; and insert no silent chips. The resulting symbol rate will be 218 Mbps.
- Using the K7_Reference to develop symbols at a rate of 31.2 Mbps, my symbol mapper 18 is configured to: map G0 to only 1 pulse; map G1 to only 1 pulse; and insert no silent chips. The resulting symbol rate will be 250 Mbps.

Finally, let us consider the following example in which n is selected to be 8, and I configure my UWB transmitter 12 so as, selectively, to bypass the systematic convolutional encoder 16:

- By bypassing both the K3_Reference and the K7_Reference, my symbol mapper 18 can easily be configured to map an input data bit (D0) to only 1 pulse with no silent chips. The resulting symbol rate will be 436 Mbps.

Figure 5:
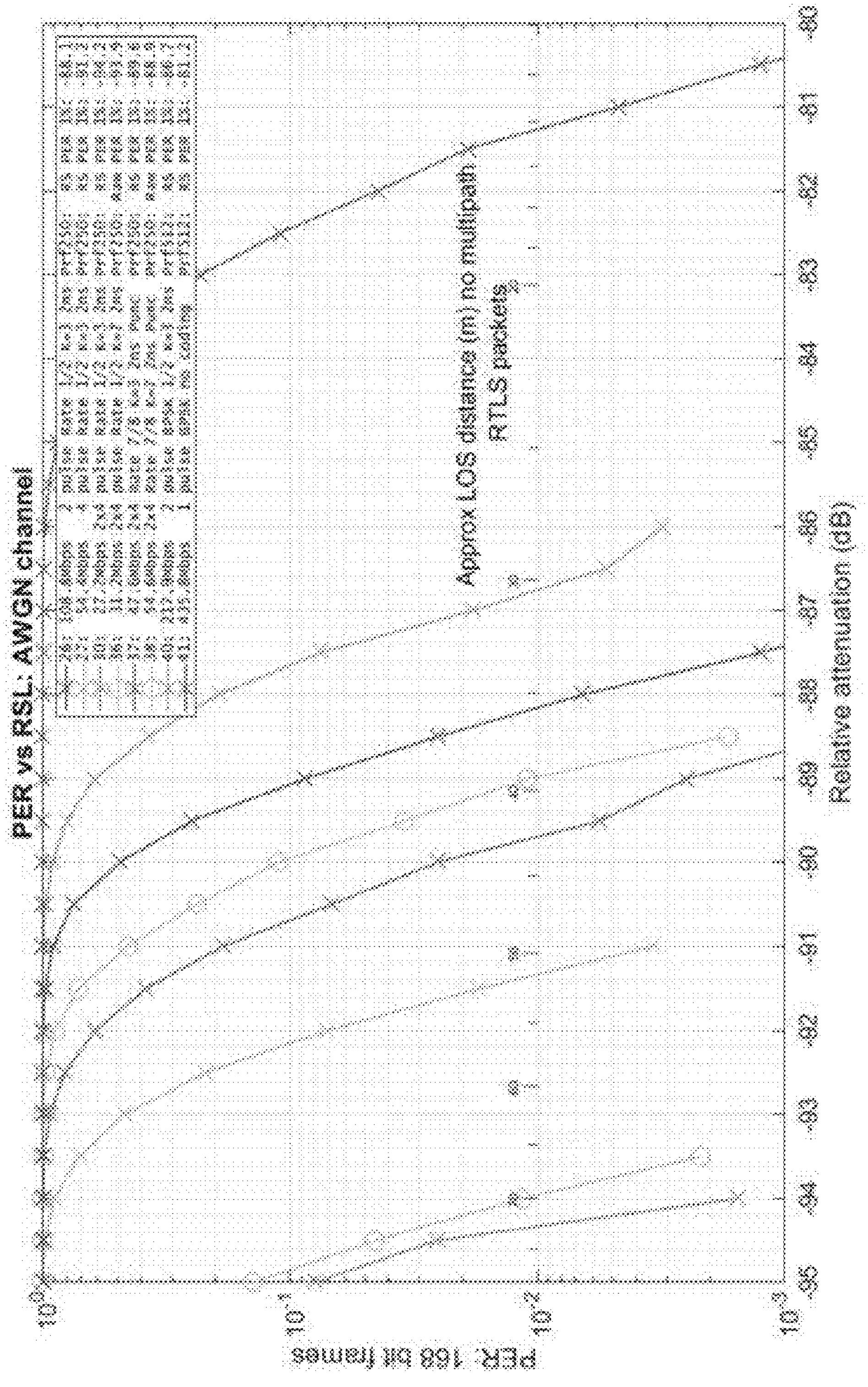
FIG. 5 illustrates, in chart form, simulation results of range versus packet error rate (PER) in an additive-white-Gaussian-Noise (AWGN) channel for some embodiments of my method.

I have developed and tested MATLAB simulation models to determine an estimated performance of each of these embodiments, 1.1-1.3 and 2.1-2.3. As can be seen in FIG. 5, performance appears to me to be reasonable for all of these embodiments when operating in a channel that is subject to additive-white-Gaussian-Noise (AWGN). In part, my invention avoids complexity in both the UWB transmitter 12 and the UWB receiver 14 that the proposed puncturing schemes will introduce. Further, I can anticipate that my invention will result in at least 2.4 dB better performance. For example, whereas power-per-bit is approximately the same in both schemes, puncturing reduces power-per-bit by approximately 42%, whereas my invention reduces power-per-bit by 50%. Further, as I have noted above, puncturing loses almost all of the resulting coding gain.

Figure 6:
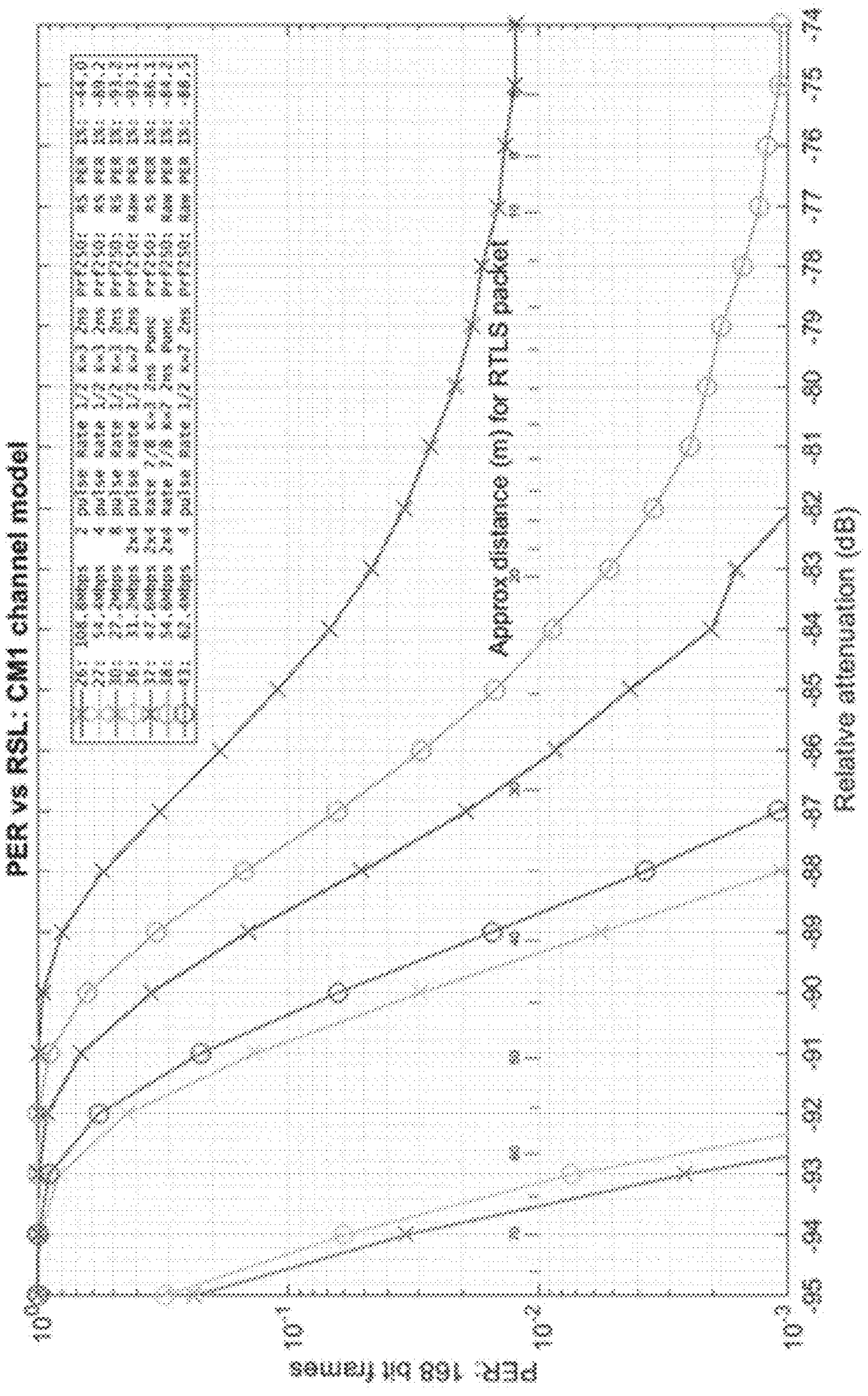
FIG. 6 illustrates, in chart form, simulation results of range versus PER in an IEEE 802.15.4a CM1 multipath channel for some embodiments of my method.

As can be seen in FIG. 6, multipath performance also appears to me to be reasonable for all of these embodiments. By way of contrast, I note that performance hits an error floor for many of the known and proposed schemes: 0.1% for the punctured scheme and 1% for the known 108 Mbps scheme. It can be I anticipate that this trend will continue and will worsen for the proposed 216 Mbps and 435 Mbps schemes; however, short channels with little or no multipath should still be able to use these very high bit rates. Further, using my invention appears to me to offer significantly better performance. For example, from the simulation results shown in FIG. 5, my 54.4 Mbps embodiment appears to be 5.2 dB better (~twice the distance) than the proposed 54.6 Mbps punctured scheme at 1% packet error rate (PER) in a multipath channel.

I submit that, while increasing the symbol rate reduces the processing gain, my approach is a better way to increase the bit rate, at least in part due to the coding gain not decreasing. As can be seen from the simulation results summarized in my Parent Provisional, my higher symbol rate approach performs better than the puncturing scheme for approximately the same bit rate. For example, from the simulation results shown in FIG. 5 and FIG. 6, I expect that my invention, configured to operate in a 108 Mbps mode, will achieve a very useful range of 14 m in a multipath channel for a 2% PER, and an excellent 36 meters in an AWGN channel at 1% PER.

One mode in the 4z Standard has a convolutional encoder which convolutionally encodes an input data bit to give 2 coded data bits and maps the 2 coded bits to 8 pulses in a symbol to achieve 27.2 Mbps. In accordance with my invention, I can double the rate to 54.4 Mbps by simply encoding 2 input bits to 2 pairs of coded bits and mapping each pair onto (8 divided by 2)=4 pulses. This can be generalized by making the 2 be any power of 2 greater than 1 (which we can call n). The 8 pulses can be any number of pulses (call it m pulses) if m is a multiple of n.

Although I have described my invention in the context of particular embodiments, one of ordinary skill in this art will readily realize that many modifications may be made in such embodiments to adapt either to specific implementations. Further, the several elements described above may be adapted so as to be operable under either hardware or software control or some combination thereof, as is known in this art. Alternatively, the several methods of my invention as disclosed herein in the context of a special purpose receiver apparatus may be embodied in computer readable code on a suitable non-transitory computer readable medium such that, when a general or special purpose computer processor executes the computer readable code, the processor executes the respective method.

Thus, it is apparent that I have provided an improved UWB method and apparatus having a higher data transmission rate. Although I have so far disclosed my invention only in the context of a packet-based UWB communication system, I appreciate that my invention is broadly applicable to other types of wireless communication systems, whether packed-based or otherwise, that perform channel sounding. Further, I submit that my invention provides performance generally comparable to the best prior art techniques, but more efficiently than known implementations of such prior art techniques.

What is claimed is:

1. An apparatus for higher data rate transmission, comprising:
- a transmitter operable to perform ultra-wideband (UWB) communication;
- a processor communicatively coupled to the transmitter; and
- a non-transitory computer readable medium including executable instructions which, when executed by the processor, causes the processor to:
  - develop a first plurality of symbols at a first rate of 31.2 Mb/s, wherein each symbol in the first plurality of symbols comprises eight pulses and eight silent chips in a first mode of operation; and
  - develop a second plurality of symbols at a second rate of 62.4 Mb/s, wherein each symbol in the second plurality of symbols comprises four pulses and four silent chips in a second mode of operation.

2. The apparatus of claim 1, wherein, in the first mode of operation, each symbol in the first plurality of symbols comprises a first set of the four pulses followed by a first set of the four silent chips followed by a second set of the four pulses followed by a second set of the four silent chips.

3. The apparatus of claim 2, wherein the processor is further configured to:
- map a first data bit ($g_0$) to the first set of the four pulses; and
- map a second data bit ($g_1$) to the second set of the four pulses.

4. The apparatus of claim 1, wherein, in the second mode of operation, each symbol in the second plurality of symbols comprises a first set of two pulses followed by a first set of two silent chips followed by a second set of the two pulses followed by a second set of the two silent chips.

5. The apparatus of claim 4, wherein the processor is further configured to:
- map a first data bit ($g_0$) to the first set of the two pulses; and
- map a second data bit ($g_1$) to the second set of the two pulses.

6. The apparatus of claim 1, wherein the processor is further configured to develop a third plurality of symbols at a third rate of 124.8 Mb/s, wherein each symbol in the third plurality of symbols comprises two pulses and two silent chips in a third mode of operation.

7. The apparatus of claim 6, wherein, in the third mode of operation, each symbol in the third plurality of symbols comprises a first pulse followed by a first silent chip followed by a second pulse followed by a second silent chip.

8. The apparatus of claim 7, wherein the processor is further configured to:
- map a first data bit ($g_0$) to the first pulse; and
- map a second data bit ($g_1$) to the second pulse.

9. The apparatus of claim 1, wherein the processor is configured to develop a fourth plurality of symbols at a fourth rate of 249.6 Mb/s, wherein each symbol in the fourth plurality of symbols comprises a first pulse and a second pulse and no silent chips in a fourth mode of operation.

10. The apparatus of claim 9, wherein the processor is further configured to:
- map a first data bit ($g_0$) to the first pulse; and
- map a second data bit ($g_1$) to the second pulse.

11. The apparatus of claim 1, wherein the processor comprises a K=7 convolutional encoder.

12. A method for performing an ultra-wideband (UWB) communication with a higher data rate transmission using a transmitter communicatively coupled to a processor, the method comprising:

developing, with the processor, a first plurality of symbols at a first rate of 31.2 Mb/s, wherein each symbol in the first plurality of symbols comprises eight pulses and eight silent chips in a first mode of operation; and developing, with the processor, a second plurality of symbols at a second rate of 62.4 Mb/s, wherein each symbol in the second plurality of symbols comprises four pulses and four silent chips in a second mode of operation.

13. The method of claim 12, wherein, in the first mode of operation, each symbol in the first plurality of symbols comprises a first set of the four pulses followed by a first set of the four silent chips followed by a second set of the four pulses followed by a second set of the four silent chips.

14. The method of claim 13, further comprising:

mapping a first data bit ($g_0$) to the first set of the four pulses; and mapping a second data bit ($g_1$) to the second set of the four pulses.

15. The method of claim 12, wherein, in the second mode of operation, each symbol in the second plurality of symbols comprises a first set of two pulses followed by a first set of two silent chips followed by a second set of the two pulses followed by a second set of the two silent chips.

16. The method of claim 15, further comprising:

mapping a first data bit ($g_0$) to the first set of the two pulses; and mapping a second data bit ($g_1$) to the second set of the two pulses.

17. The method of claim 12, wherein the method further comprises developing a third plurality of symbols at a third rate of 124.8 Mb/s, wherein each symbol in the third plurality of symbols comprises two pulses and two silent chips in a third mode of operation.

18. The method of claim 17, wherein, in the third mode of operation, each symbol in the third plurality of symbols comprises a first pulse followed by a first silent chip followed by a second pulse followed by a second silent chip.

19. The method of claim 18, further comprising:

mapping a first data bit ($g_0$) to the first pulse; and mapping a second data bit ($g_1$) to the second pulse.

20. The method of claim 17, wherein the method further comprises developing a fourth plurality of symbols at a fourth rate of 249.6 Mb/s, wherein each symbol in the fourth plurality of symbols comprises a first pulse and a second pulse and no silent chips in a fourth mode of operation.

21. The method of claim 20, further comprising:

mapping a first data bit ($g_0$) to the first pulse; and mapping a second data bit ($g_1$) to the second pulse.

22. The method of claim 12, wherein the processor comprises a K=7 convolutional encoder.

* * * * *